US008861246B2

(12) United States Patent
King

(10) Patent No.: US 8,861,246 B2
(45) Date of Patent: *Oct. 14, 2014

(54) PHASE INTERPOLATORS AND PUSH-PULL BUFFERS

(71) Applicant: Micron Technology, Inc., Boise, ID (US)

(72) Inventor: Gregory A. King, Hastings, MN (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/847,176

(22) Filed: Mar. 19, 2013

(65) Prior Publication Data

US 2013/0208549 A1    Aug. 15, 2013

Related U.S. Application Data

(63) Continuation of application No. 12/970,086, filed on Dec. 16, 2010, now Pat. No. 8,400,808.

(51) Int. Cl.
G11C 5/06 (2006.01)
G11C 8/06 (2006.01)
H03H 11/16 (2006.01)
G11C 7/10 (2006.01)
G11C 7/22 (2006.01)

(52) U.S. Cl.
CPC .............. H03H 11/16 (2013.01); G11C 8/06 (2013.01); G11C 7/222 (2013.01); G11C 7/1057 (2013.01)
USPC ....................................... 365/63; 365/189.05

(58) Field of Classification Search
USPC ............................................. 365/63, 189.05
See application file for complete search history.

(56) References Cited

U.S. PATENT DOCUMENTS

| 5,179,303 A | 1/1993 | Searles et al. |
| 5,263,032 A | 11/1993 | Porter et al. |
| 5,748,914 A | 5/1998 | Barth et al. |
| 5,774,475 A | 6/1998 | Qureshi |
| 5,960,008 A | 9/1999 | Osawa et al. |
| 5,982,684 A | 11/1999 | Schwartzlow et al. |
| 6,052,329 A | 4/2000 | Nishino et al. |
| 6,122,688 A | 9/2000 | Barth et al. |
| 6,177,807 B1 | 1/2001 | Bertin et al. |

(Continued)

FOREIGN PATENT DOCUMENTS

| JP | 05-265872 | 10/1993 | |
| JP | 07074620 A | * 3/1995 | ......... H03K 19/0952 |

(Continued)

OTHER PUBLICATIONS

Search Report dated Mar. 11, 2013 for TW Patent Application No. 098114848.

(Continued)

Primary Examiner — Michael Tran
(74) Attorney, Agent, or Firm — Dorsey & Whitney LLP

(57) ABSTRACT

Interpolator systems are described utilizing one or more push-pull buffers to generate output clock signals that may be provided as inputs to a phase interpolator. The more linear slope on the output of the push-pull buffer may improve the linearity of a phase interpolator using the clock signals output from the push-pull buffers.

21 Claims, 8 Drawing Sheets

(56) References Cited

U.S. PATENT DOCUMENTS

| | | |
|---|---|---|
| 6,181,616 B1 | 1/2001 | Byrd |
| 6,247,138 B1 | 6/2001 | Tamura et al. |
| 6,285,211 B1 | 9/2001 | Sample et al. |
| 6,363,017 B2 | 3/2002 | Polney |
| 6,401,213 B1 | 6/2002 | Jeddeloh |
| 6,519,194 B2 | 2/2003 | Tsujino et al. |
| 6,574,626 B1 | 6/2003 | Regelman et al. |
| 6,650,157 B2 | 11/2003 | Amick et al. |
| 6,658,523 B2 | 12/2003 | Janzen et al. |
| 6,839,260 B2 | 1/2005 | Ishii |
| 6,882,304 B2 | 4/2005 | Winter et al. |
| 6,889,334 B1 | 5/2005 | Magro et al. |
| 6,907,555 B1 | 6/2005 | Nomura et al. |
| 7,058,865 B2 | 6/2006 | Mori et al. |
| 7,107,424 B1 | 9/2006 | Avakian et al. |
| 7,135,905 B2 | 11/2006 | Teo et al. |
| 7,149,134 B2 | 12/2006 | Streif et al. |
| 7,168,005 B2 | 1/2007 | Adams et al. |
| 7,171,596 B2 | 1/2007 | Boehler |
| 7,184,916 B2 | 2/2007 | Resnick et al. |
| 7,197,101 B2 | 3/2007 | Glenn et al. |
| 7,203,259 B2 | 4/2007 | Glenn et al. |
| 7,243,469 B2 | 7/2007 | Miller et al. |
| 7,389,375 B2 | 6/2008 | Gower et al. |
| 7,466,179 B2 | 12/2008 | Huang et al. |
| 7,489,743 B2 | 2/2009 | Koh et al. |
| 7,567,476 B2 | 7/2009 | Ishikawa |
| 7,697,369 B2 | 4/2010 | Koshizuka |
| 7,710,144 B2 | 5/2010 | Dreps et al. |
| 7,764,564 B2 | 7/2010 | Saito et al. |
| 7,772,907 B2 | 8/2010 | Kim et al. |
| 7,855,931 B2 | 12/2010 | LaBerge et al. |
| 7,979,757 B2 | 7/2011 | Jeddeloh |
| 8,010,866 B2 | 8/2011 | Laberge et al. |
| 8,127,204 B2 | 2/2012 | Hargan |
| 8,248,138 B2 | 8/2012 | Liu |
| 8,289,760 B2 | 10/2012 | Jeddeloh |
| 8,356,138 B1 | 1/2013 | Kulkarni et al. |
| 8,400,808 B2 | 3/2013 | King |
| 2002/0004893 A1 | 1/2002 | Chang |
| 2002/0054516 A1 | 5/2002 | Taruishi et al. |
| 2002/0097613 A1 | 7/2002 | Raynham |
| 2002/0125933 A1 | 9/2002 | Tamura et al. |
| 2002/0130687 A1 | 9/2002 | Duesman |
| 2002/0133666 A1 | 9/2002 | Janzen et al. |
| 2002/0138688 A1 | 9/2002 | Hsu et al. |
| 2003/0041299 A1 | 2/2003 | Kanazawa et al. |
| 2003/0132790 A1 | 7/2003 | Amick et al. |
| 2004/0073767 A1 | 4/2004 | Johnson et al. |
| 2004/0098545 A1 | 5/2004 | Pline et al. |
| 2004/0160833 A1 | 8/2004 | Suzuki |
| 2004/0168101 A1 | 8/2004 | Kubo |
| 2004/0199840 A1 | 10/2004 | Takeoka et al. |
| 2004/0206982 A1 | 10/2004 | Lee et al. |
| 2004/0237023 A1 | 11/2004 | Takahashi et al. |
| 2004/0246026 A1 | 12/2004 | Wang et al. |
| 2005/0005230 A1 | 1/2005 | Koga et al. |
| 2005/0071707 A1 | 3/2005 | Hampel |
| 2005/0091471 A1 | 4/2005 | Conner et al. |
| 2005/0144546 A1 | 6/2005 | Igeta et al. |
| 2005/0157560 A1 | 7/2005 | Hosono et al. |
| 2005/0174877 A1 | 8/2005 | Cho et al. |
| 2005/0278490 A1 | 12/2005 | Murayama |
| 2005/0289435 A1 | 12/2005 | Mulla et al. |
| 2006/0036827 A1 | 2/2006 | Dell et al. |
| 2006/0059406 A1 | 3/2006 | Micheloni et al. |
| 2006/0123320 A1 | 6/2006 | Vogt |
| 2006/0126369 A1 | 6/2006 | Raghuram |
| 2006/0233012 A1 | 10/2006 | Sekiguchi et al. |
| 2006/0245291 A1 | 11/2006 | Sakaitani |
| 2006/0253723 A1 | 11/2006 | Wu et al. |
| 2006/0262587 A1 | 11/2006 | Matsui et al. |
| 2006/0273455 A1 | 12/2006 | Williams et al. |
| 2007/0058410 A1 | 3/2007 | Rajan |
| 2007/0070669 A1 | 3/2007 | Tsern |
| 2007/0074093 A1 | 3/2007 | Lasser |
| 2007/0136645 A1 | 6/2007 | Hsueh et al. |
| 2007/0271424 A1 | 11/2007 | Lee et al. |
| 2008/0147897 A1 | 6/2008 | Talbot |
| 2008/0150088 A1 | 6/2008 | Reed et al. |
| 2008/0250292 A1 | 10/2008 | Djordjevic |
| 2009/0006775 A1 | 1/2009 | Bartley et al. |
| 2009/0016130 A1 | 1/2009 | Menke et al. |
| 2009/0021992 A1 | 1/2009 | Oh |
| 2009/0091968 A1 | 4/2009 | Dietrich et al. |
| 2009/0196093 A1 | 8/2009 | Happ et al. |
| 2009/0251189 A1 | 10/2009 | Hsieh |
| 2009/0300314 A1 | 12/2009 | Laberge et al. |
| 2009/0300444 A1 | 12/2009 | Jeddeloh |
| 2010/0005217 A1 | 1/2010 | Jeddeloh |
| 2010/0005376 A1 | 1/2010 | Laberge et al. |
| 2010/0014364 A1 | 1/2010 | Laberge et al. |
| 2010/0031129 A1 | 2/2010 | Hargan |
| 2010/0042889 A1 | 2/2010 | Hargan |
| 2010/0070696 A1 | 3/2010 | Blankenship |
| 2010/0079180 A1 | 4/2010 | Kim et al. |
| 2010/0091537 A1 | 4/2010 | Best et al. |
| 2010/0110748 A1 | 5/2010 | Best |
| 2011/0075497 A1 | 3/2011 | Laberge et al. |
| 2011/0271158 A1 | 11/2011 | Jeddeloh |
| 2011/0296227 A1 | 12/2011 | LaBerge et al. |
| 2012/0144276 A1 | 6/2012 | Hargan |
| 2012/0155142 A1 | 6/2012 | King |
| 2013/0318298 A1 | 11/2013 | LaBerge et al. |
| 2013/0346722 A1 | 12/2013 | LaBerge et al. |
| 2014/0053040 A1 | 2/2014 | Hargan |

FOREIGN PATENT DOCUMENTS

| | | |
|---|---|---|
| JP | 11-102599 | 4/1999 |
| JP | 2003-303139 | 10/2003 |
| JP | 2004-327474 | 11/2004 |
| JP | 2005-4947 | 1/2005 |
| JP | 2007-140948 | 6/2007 |
| JP | 2007-226876 | 9/2007 |
| JP | 2007-328636 | 12/2007 |
| JP | 2008-112503 | 5/2008 |
| JP | 2008-140220 | 6/2008 |
| JP | 2010-514080 | 4/2010 |
| JP | WO 2012/060097 | 5/2012 |
| WO | 2007/038225 | 4/2007 |
| WO | WO-2007/095080 | 8/2007 |
| WO | 2008/054696 | 5/2008 |
| WO | WO 2008/076790 | 6/2008 |
| WO | 2009/148863 | 12/2009 |
| WO | 2010/002561 A2 | 1/2010 |
| WO | 2010/011503 A2 | 1/2010 |
| WO | 2012/082338 | 6/2012 |

OTHER PUBLICATIONS

Office Action dated Mar. 11, 2013 for TW Patent Application No. 098114848.
International Search Report and Written Opinion dated Jul. 31, 2012 for Application. No. PCT/US2011/062009.
International Search Report and Written Opinion dated Feb. 11, 2010 for Application No. PCT/US2009/050155.
Notice of Final Rejection dated Feb. 2, 2013 for KR Application. No. 10-2011-7001535.
Notice of Preliminary Rejection dated Jun. 18, 2012 for KR Application. No. 10-2011-7001535.
Notice of Preliminary Rejection dated Jun. 21, 2012 for KR Application. No. 10-2011-7002786.
Office Action dated Oct. 30, 2012 for KR Application No. 10-2012-7021899.
Office action dated Nov. 2, 2012 for CN Application No. 200980125792.2.
Office Action dated Nov. 6, 2012 for JP Application No. 2011-516419.
International Search Report and Written Opinion dated Feb. 18, 2010 for Application No. PCT/US2009/046898.

(56) References Cited

OTHER PUBLICATIONS

Notice of Preliminary Rejection dated Sep. 24, 2012 for KR Application No. 10-2011-7002671.
Extended European Search Report dated Aug. 2, 2011 for European Patent Application No. 09800787.5.
Extended European Search Report dated Aug. 29, 2011 for European Application No. 09774012.0.
International Search Report and Written Opinion dated Jan. 6, 2010 for Application No. PCT/US2009/045059.
International Search Report and Written Opinion dated Jan. 22, 2010 for Application No. PCT/US2009/046956.
First Office Action dated Jan. 25, 2013 for CN Application No. 20098012573.7.
Office Action for Appl No. TW100145110, issued Jan. 23, 2014.

\* cited by examiner

PHASE INTERPOLATORS AND PUSH-PULL BUFFERS

CROSS REFERENCE TO RELATED APPLICATION(S)

This application is a continuation of U.S. patent application Ser. No. 12/970,086, filed Dec. 16, 2010, and issued as U.S. Pat. No. 8,400,808 on Mar. 19, 2013. This application and patent are incorporated herein by reference, in their entirety, for any purpose.

TECHNICAL FIELD

Embodiments of the invention relate generally to electronic circuitry. Examples described include phase interpolators and buffers.

BACKGROUND

Phase interpolators may be used to provide phase control of a clock signal. A phase interpolator receives multiple input clock signals, each having a different phase. The phase interpolator mixes two of the incoming clock phases to generate an output clock signal having a programmable phase. For example, two input clock signals may be provided to a phase interpolator, one having a 0 degree phase, and one having a 90 degree phase. The phase interpolator may then output a clock signal having a phase between 0 and 90 degrees. The phase interpolator includes a mixer which may weigh the input clock signals and combine them to generate the output signal having the programmable phase.

For a larger range, a phase interpolator may select between multiple input signals. For example, input clock signals having a 0 degree phase, a 90 degree phase, a 180 degree phase, and a 270 degree phase may be available to a phase interpolator. A selector may be provided to select the input clock signals provided to the phase interpolator. When the 0 degree phase and 90 degree phase signals are selected, the phase interpolator may generate an output clock signal having a programmable output phase between 0 and 90 degrees. When the 90 degree phase and 180 degree phase input signals are selected, the phase interpolator may generate an output clock signal having a programmable output phase between 90 and 180 degrees.

One metric used to describe phase interpolators is their linearity. To improve the linearity of the placement of the phase of the programmable output clock signal, current mode logic buffers have been used to provide the input clock signals to a phase interpolator circuit containing a buffer. The current mode logic buffers may improve the linearity of operation of the phase interpolator circuit.

FIG. 1 is a schematic illustration of a current mode logic buffer. The current mode logic buffer 100 may receive a differential clock signal, INN and INP and output a differential output signal OUTN and OUTP. The INN and INP input clock signals may be provided to gates of n-FET transistors 105 and 107 respectively. Load resistors 110 and 112 are coupled to drain terminals of the transistors 105 and 107, respectively. A transistor 120 is coupled to the source terminals of the transistors 105 and 107. The transistor 120 receives a bias voltage BN at its gate terminal and may draw a corresponding amount of current from the transistors 105 and 107.

The INP signal may turn on the transistor 107, allowing current flow through the resistor 112 and generating the OUTN signal. The INN signal may turn on the transistor 105, allowing current flow through the resistor 110 and generating the OUTP signal.

FIG. 2 is an example graph illustrating an output signal from a current mode logic buffer. The graph illustrates the voltage of the OUTN signal over time. The resistances 112 and 110 of the current mode logic buffer 100 in FIG. 1 create an RC effect on the output waveform. The output signal 210 is illustrated in FIG. 2, and the RC effect generated by the resistances 112 and 110 can be seen by the variation in slope of the output signal.

DETAILED DESCRIPTION

Certain details are set forth below to provide a sufficient understanding of embodiments of the invention. However, it will be clear to one skilled in the art that embodiments of the invention may be practiced without various of these particular details. In some instances, well-known circuits, control signals, timing protocols, and software operations may not have been shown in detail in order to avoid unnecessarily obscuring the described embodiments of the invention.

Clock signals are described below, and generally refer to a periodic signal having a duty cycle. Phases of clock signals are also described below. A phase of a clock signal generally refers to the timing of a peak or rising edge of the signal. 0, 90, 180, and 270 degree signals may be described, which generally refer to the position of the peak or rising edge of the signal relative to the entire clock period. For example, a clock signal having a 90 degree phase may generally having a rising edge or peak which is offset by ¼ of a clock period from a starting measurement point.

As described above, current mode logic buffers have been used to generate output signals that may be provided to an input of a phase interpolator. The RC effect on the output signal, however, may be undesirable because of the variation in slope of the signal over time, which may contribute to non-linear behavior of a phase interpolator.

Embodiments of the present invention utilize one or more push-pull buffers to generate output clock signals that may be provided as inputs to a phase interpolator. The more linear slope on the output of the push-pull buffer, relative to that of the current mode logic buffers described above, may improve the linearity of a phase interpolator using the clock signals output from the push-pull buffers.

Figure 3:
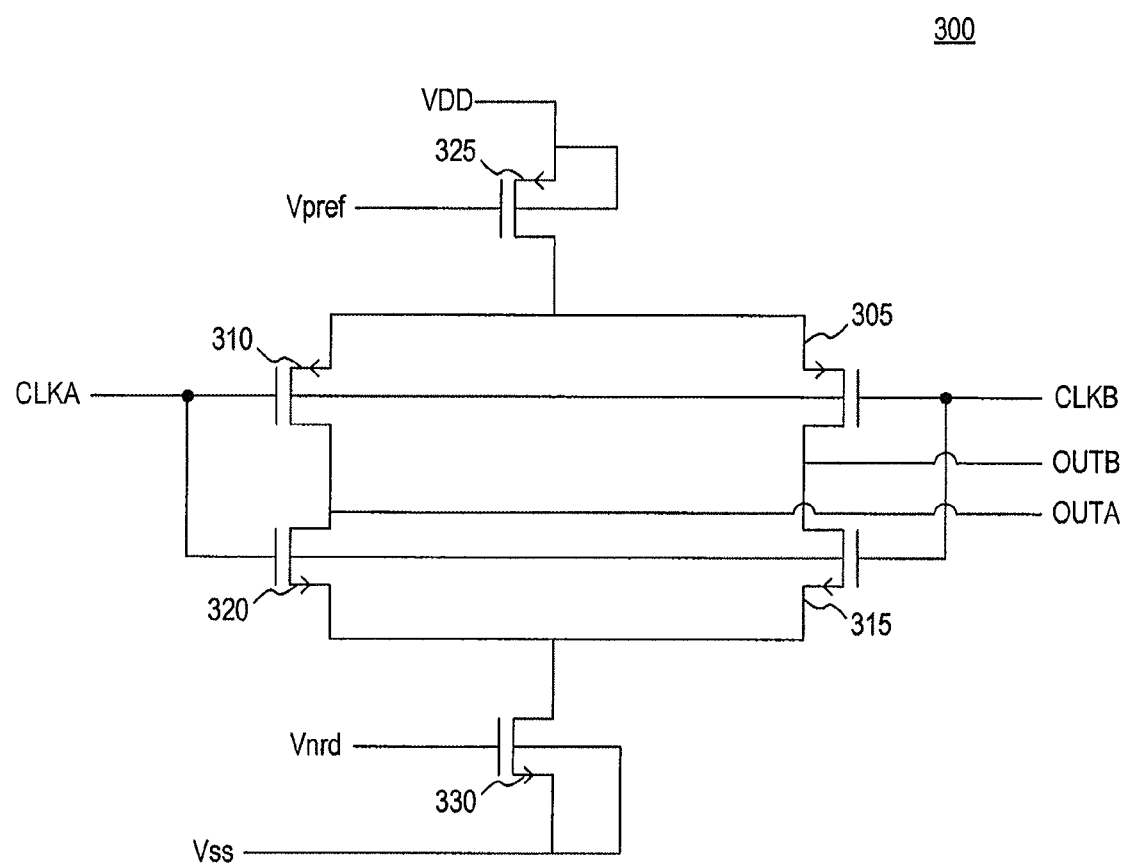
FIG. 3 is a schematic illustration of a push-pull buffer.

FIG. 3 is a schematic illustration of a push-pull buffer. The push-pull buffer 300 includes a pair of p-FET transistors 305, 310 coupled to a pair of n-FET transistors 315, 320. The drain terminal of the p-FET transistor 310 is coupled to the drain terminal of the n-FET transistor 320. The drain terminal of the p-FET transistor 305 is coupled to the drain terminal of the n-FET transistor 315. The source terminals of the p-FET transistors 310 and 305 are coupled to one another and to a current source. The current source is implemented by a p-FET transistor 325 having its drain terminal coupled to the source terminals of the p-FET transistors 305 and 310. A bias voltage, $V_{pref}$, is provided to the gate terminal of the p-FET transistor 325 to turn on the p-FET transistor 325 and provide a current. The source terminals of the n-FET transistors 315 and 320 are coupled to one another and to another current source. The current source is implemented by an n-FET transistor 330 having its drain terminal coupled to the source terminals of the n-FET transistors 315 and 320. A bias voltage, $V_{nref}$, is provided to the gate terminal of the n-FET transistor 330 to turn the transistor on and provide a current.

Differential input clock signals, CLKA and CLKB, may be provided to inputs of the push-pull buffer 300. The CLKA signal may be provided to the gate terminals of the p-FET transistor 310 and the n-FET transistor 320. The CLKB signal may be provided to the gate terminals of the p-FET transistor 305 and the n-FET transistor 315. A differential output signal may be generated by the push-pull buffer 300. The differential output signal OUTA may be generated at the drain terminals of the transistors 310 and 320. The differential output signal OUTB may be generated at the drain terminals of the transistors 305 and 315.

Figure 2:
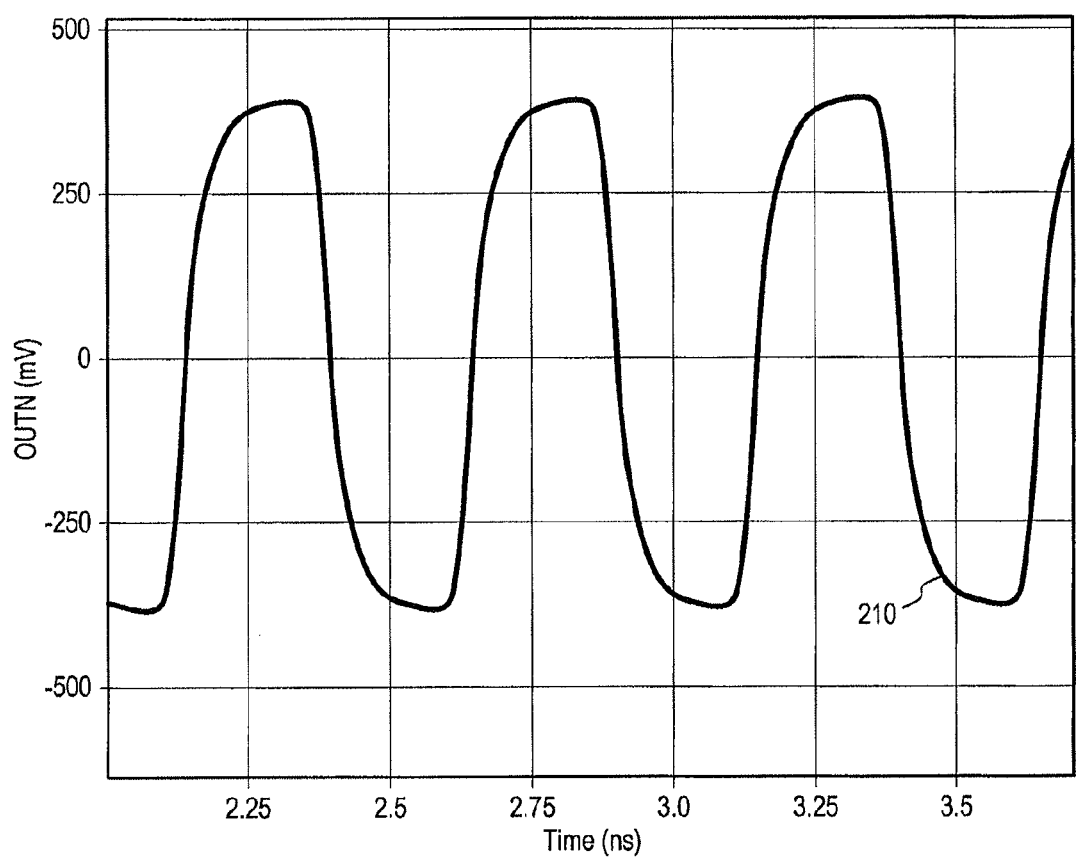
FIG. 2 is an example graph illustrating an output signal from a current mode logic buffer.
Figure 4:
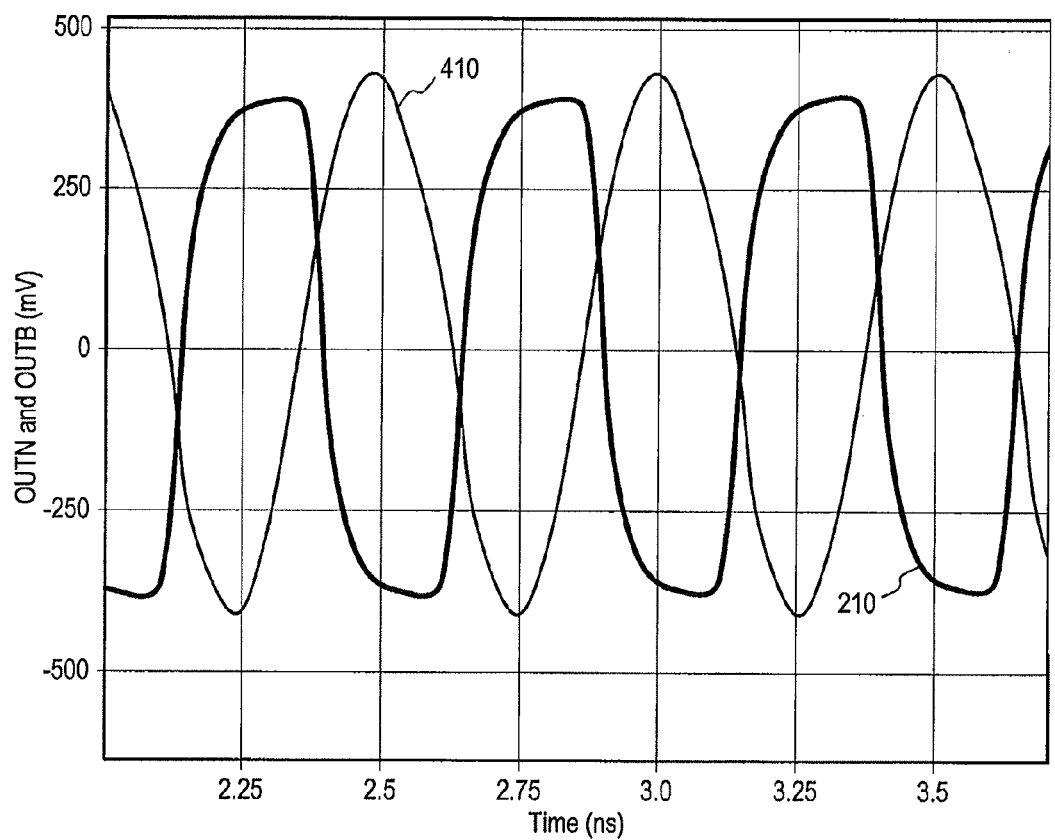
FIG. 4 is an example graph illustrating an output signal from a current mode logic buffer and a push-pull buffer.

FIG. 4 is an example graph illustrating an output signal from a current mode logic buffer and a push-pull buffer. The signal from the current mode logic buffer 210, is the same as described above with regard to FIG. 2. An output signal from the push-pull buffer 410, which may correspond to the signal OUTB of FIG. 3, is also illustrated. Due in part to the use of both n-FET and p-FET pairs of transistors, the push-pull buffer output signal 410 has a more constant slope. The use of both n-FET and p-FET transistor pairs in the push-pull buffer 300 shown in FIG. 3 may allow for a fixed current output that may provide constant drive strength over the output swing.

Figure 5:
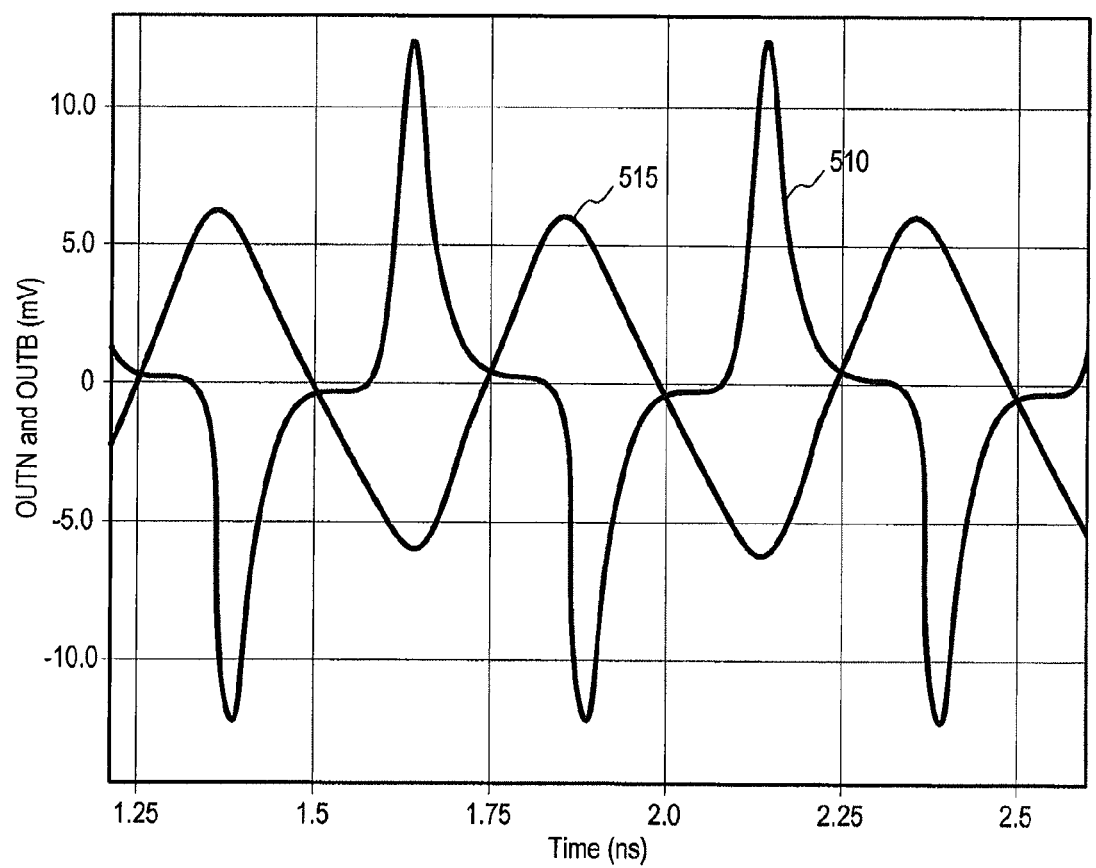
FIG. 5 is an example graph illustrating the slope of the current mode logic buffer and push-pull buffer output signals of FIG. 4.

FIG. 5 is an example graph illustrating the slope of the current mode logic buffer and push-pull buffer output signals of FIG. 4. The line 510 illustrates the slope of the current mode logic buffer output signal 201 of FIGS. 2 and 4. As shown in FIG. 5, the slope 510 may contain significant non-linearities. The discontinuity in the slope may be caused in part by the RC component imposed by the load resistors in current mode buffer circuits, as has been described above. In contrast, the line 515 illustrates the slope of the push-pull buffer output signal 410 of FIG. 4. The line 515 exhibits greater linearity than the line 510. Accordingly, the output of a push-pull buffer circuit may be advantageous for providing a signal to a phase interpolator by improving the linearity of the phase interpolator.

Figure 6:
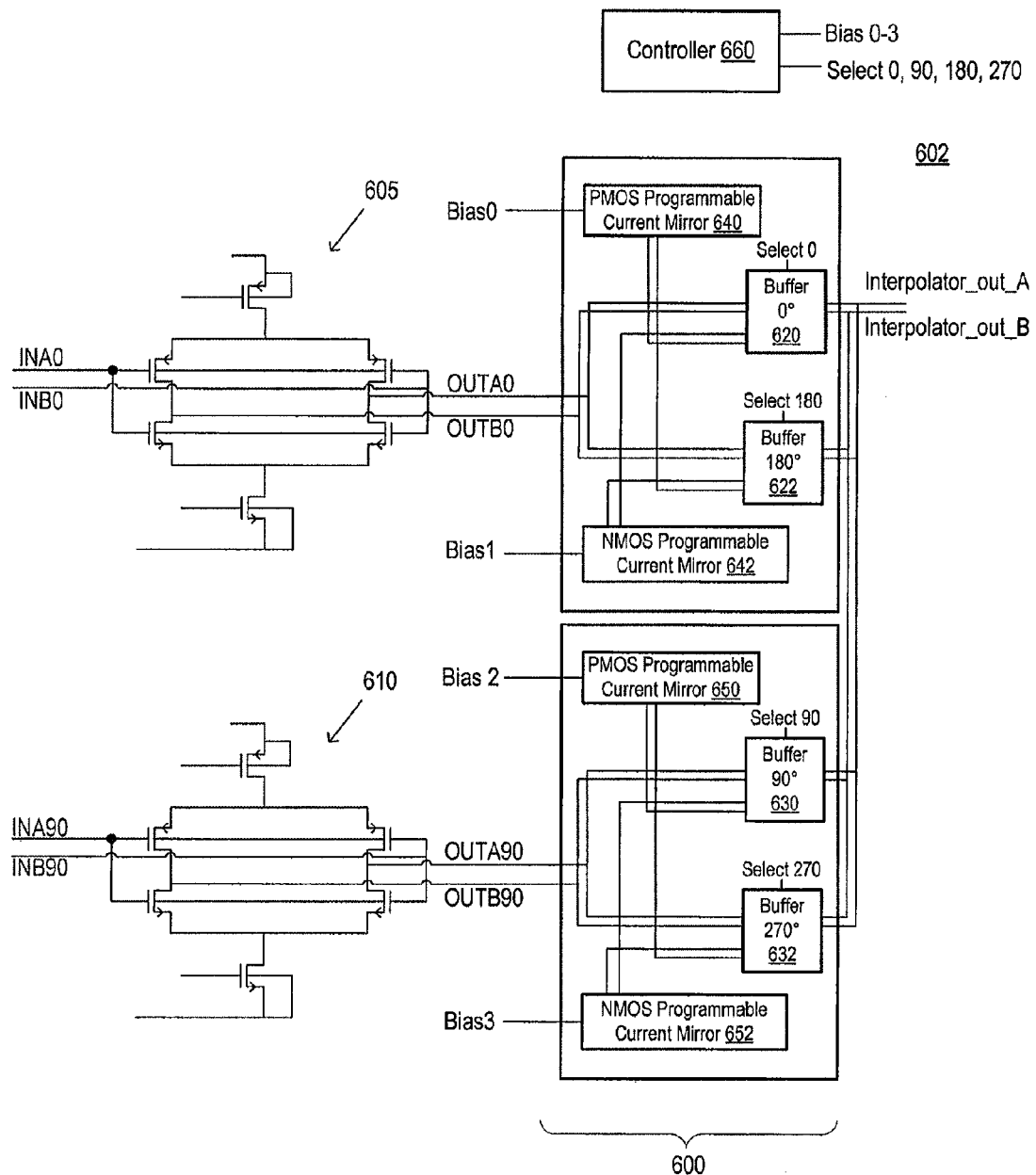
FIG. 6 is a schematic illustration of an interpolator system.

FIG. 6 is a schematic illustration of an interpolator system 602. Two push-pull buffers 605 and 610 are coupled to an interpolator 600. The push-pull buffers 605 and 610 may be implemented using the push-pull buffer shown in FIG. 3, for example. Referring back to FIG. 6, the output of the push-pull buffer 605 is coupled to a first input of the interpolator 600. The output of the push-pull buffer 610 is coupled to another input of the interpolator 600. The interpolator 600 is configured to mix the signals received from the push-pull buffers 605 and 610 to generate an output signal having a programmable phase based on the phases of the signals received from the buffers 605 and 610. The push-pull buffer 605 may receive a clock signal having a 0 degree phase—INA0 and INB0 in FIG. 6. The push-pull buffer 605 may generate output clock signals having a 0 degree phase—OUTA0 and OUTB0 in FIG. 6. The push-pull buffer 610 may receive a clock signal having a 90 degree phase—INA90 and INB90 in FIG. 6. The push-pull buffer 610 may generate output clock signals having a 90 degree phase—OUTA90 and OUTB90 in FIG. 6. In this manner, the interpolator 600 may receive a first set of signals (OUTA0 and OUTB0) having a 0 degree phase and a second set of signals (OUTA90 and OUTB90) having a 90 degree phase. Although 0 and 90 degree phases are used here as examples of two clock phases which may be received, any phases may be used.

Each pair of clock signals received by the interpolator 600 may be provided to two buffers, with opposite polarity used to provide the signals to one of the buffers. So, for example, the OUTA0 and OUTB0 signals are provided to buffers 620 and 622 in FIG. 6. The OUTA0 and OUTB0 signals are provided with opposite polarity to the buffer 622 as to the buffer 620. Accordingly, the buffer 620 may generate output signals having a 0 degree clock phase, while the buffer 622 may generate output signals having a 180 degree clock phase. Accordingly, output signals having 0, 90, 180, and 270 degree phases may be used to generate an output signal having programmable phase, as will be described further below. Although 0, 90, 180, and 270 degree phases have been used in this example, a greater number, or fewer, clock phases may be used in other embodiments. Moreover, different clock phases may be used.

The OUTA90 and OUTB90 signals are provided to buffers 630 and 632 in FIG. 6. Accordingly, the buffer 630 may generate output signals having a 90 degree clock phase, while the buffer 632 may generate output signals having a 270 degree clock phase. The buffers 620, 622, 630, and 630 receive control (e.g. select) signals corresponding to a selection of which buffers are activated. The buffer 620 may be activated responsive to receipt of a select0 signals. The buffer 622 may be activated responsive to receipt of a select 180 signal, the buffer 630 may be activated responsive to receipt of a select 90 signal, and the buffer 632 may be activated responsive to receipt of a select 270 signal. Typically, either the buffer 620 or 622 is activated and either the buffer 630 or 632 is activated by the appropriate control signals. This may allow for a range of mixed output signals. For example, if the buffer 620 and the buffer 630 are activated, the output of the interpolator 600 may be a signal having a programmable phase between 0 and 90 degrees. If the buffer 630 and the buffer 622 are activated, the output of the interpolator 600 may be a signal having a programmable phase between 90 and 180 degrees. If the buffers 622 and 632 are activated, the output of the interpolator 600 may be a signal having a programmable phase between 180 and 270 degrees. If the buffers 620 and 632 are activated, the output of the interpolator 600 may be a signal having a programmable phase between 270 and 0 degrees. The interpolator output signals are shown is Interpolator_out_A and Interpolator_out_B in FIG. 6.

The output phase of the Interpolator_out_A and Interpolator_out_B signals may be programmed by selecting an amount of current provided by p-FET and n-FET programmable current mirrors 640, 642, 650, and 652. The p-FET current mirror 640 may provide a current to the buffers 620 and 622 responsive to a control signal, such as the bias0 signal. The n-FET current mirror 642 may provide a current to the buffers 620 and 622 responsive to another control signal, such as the bias1 signal. The p-FET current mirror 650 may provide a current to the buffers 630 and 632 responsive to the bias2 signal. The n-FET current mirror 652 may provide a current to the buffers 630 and 632 responsive to the bias3 signal. Recall under typical conditions either the buffer 620 or the buffer 622 will be active and either the buffer 630 or 632 will be active. The bias0-3 signals are typically generated such that as the currents provided to the buffers 620 and 622 increase, the currents provided to the buffers 630 and 632 decrease. That is, a sum of current provided to the buffer 620 or 622 and that provided to the buffer 630 or 632 may generally be constant, so the current serves as a weighting. The more current provided to the buffer 620 or 622, the closer the output signal will be to 0 or 180 degrees, respectively. Conversely, the more current provided to the buffer 630 or 632, the closer the output signal will be to 90 or 270 degrees, respectively. In this manner, the phase of the output signal may be programmed.

The buffers 620, 622, 630, and 632 may have a similar push-pull structure to the buffers 605 and 610. That is, the buffers 620, 622, 630, and 632, may each include at least one p-FET and one n-FET transistor, such as the transistors 305, 310, 315, and 320 of FIG. 3. This may allow for the advantageous linear properties of the push-pull buffer to be provided to the interpolator output signal. Similarly, the p-FET programmable current mirrors 640, 650 may be implemented using, for example, the transistor 325 of FIG. 3. The n-FET programmable current mirrors 642, 652, may be implemented using, for example, the transistor 330 of FIG. 3.

A controller 660 may generate the bias0-3 signals and the select signals applied to the interpolator 600. Although four bias signals and four select signals are shown, one for each buffer and each programmable current mirror, in other examples, the buffers and programmable current mirrors may share select or bias signals, or the select or bias signals may be generated by circuitry (e.g. logic gates) coupled between the controller 660 and the buffers or current mirrors. In some examples, current sources other than current mirrors may be used.

Figure 1:
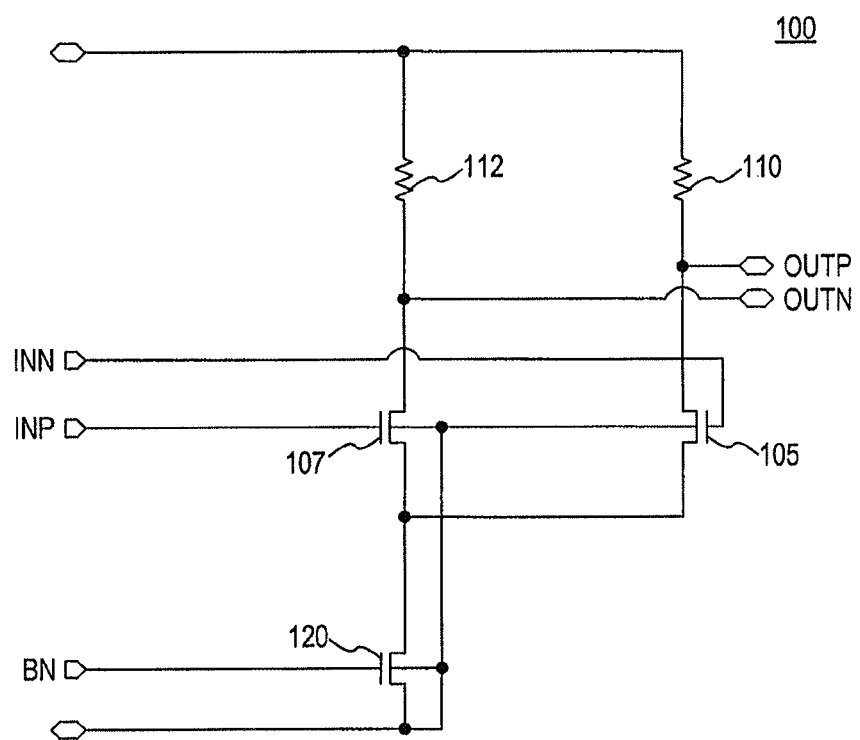
FIG. 1 is a schematic illustration of a current mode logic buffer.

Embodiments of the present invention may advantageously have reduced variation over different process corners, and in some examples the reduced variation is reduced as compared with standard interpolators employing current mode logic buffers, described above with reference to FIG. 1. Interpolators employing current mode logic buffers may require that the edge rates be reduced to maintain enough linearity in the interpolator. Edge rates are typically delayed by delaying slew rates of a current mode logic buffer using loading capacitors on the output of the current mode logic buffer. These loading capacitors may increase the RC effect on the output signal, which, as described above, has a deleterious effect on the linearity of the interpolator. Further, the capacitors require semiconductor chip area and power. Embodiments of interpolators using push-pull buffers, as described above, may not require loading capacitors, reducing the required chip area and power, and further improving linearity.

Interpolators according to embodiments of the present invention may be used in any of a variety of application where a periodic signal having a programmable output phase is desired. Interpolators according to embodiments of the present invention may be used, for example, to sweep a strobe signal across data and/or measure an opening of an eye diagram. Interpolators may accordingly be used in tester chips, for example. In other examples, interpolators according to embodiments of the present invention may be used in serial links where one chip may receive data from another chip. The serial link should clock incoming data at a center of an incoming data eye. A phase interpolator may be used to generate and/or adjust the clock signal used to clock incoming data. In some examples, the data eye may be small, such as 100 ps or less at 10 GB/s operating rates, accordingly, phase interpolator linearity may be advantageous.

Figure 7:
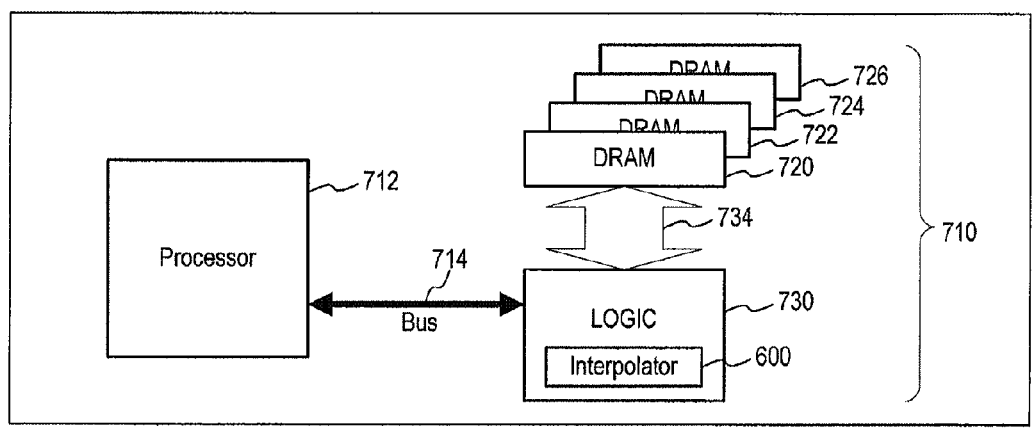
FIG. 7 is a schematic illustration of a portion of a computer system.

Embodiments of interpolators according to embodiments of the present invention may be used in memory systems, and for example, in memory systems including stacked memory chips. FIG. 7 is a schematic illustration of a portion of a computer system 700. A memory device 710 may be coupled to a processor 712 through a bus 714 which may be divided into downstream lanes and upstream lanes (not shown in FIG. 7). The memory device 710 may include 4 memory die 720, 722, 724, 726, which may be identical to each other, stacked on top of each other. The memory die 720, 722, 724, and 726 may be coupled to one another using, for example, conductive through-wafer interconnects. Although the memory device 710 as shown includes 4 memory die, any number may be used. The memory die 720, 722, 724, 726 may be stacked on top of a logic die 730, which may serve as the interface with the processor 712. The logic die 730 may implement a variety of functions including, but not limited to, memory management functions, such as power management and refresh of memory cells in the memory die 720, 722, 724, 726. In some embodiments, the logic die 730 may implement test and/or repair capabilities. The logic die 730 may include one or more interpolator systems as described herein, such as the interpolator system 602. The interpolator may be used, for example, to clock the bus 714 between the processor 712 and the logic die 730. The controller 660 shown in FIG. 6 may also be included on the logic die 730.

The memory die 720, 722, 724, 726 may be connected to each other and to the logic die 730 by a bus 734. The bus 34 may be implemented with, for example, through-wafer interconnects such as through silicon vias ("TSVs"), which may include a large number of conductors extending through the memory die 720, 722, 724, 726 at the same locations on the memory die and connect to respective conductors formed on the die 720, 722, 724, 726. In one embodiment, each of the memory die 720, 722, 724, 726 may be divided into 16 autonomous partitions, each of which may contain 2 or 4 independent memory banks. In such case, the partitions of each die 720, 722, 724, 726 that are stacked on top each other may be independently accessed for read and write operations. Each set of 16 stacked partitions may be referred to as a "vault." Thus, the memory device 710 may contain 16 vaults.

Figure 8:
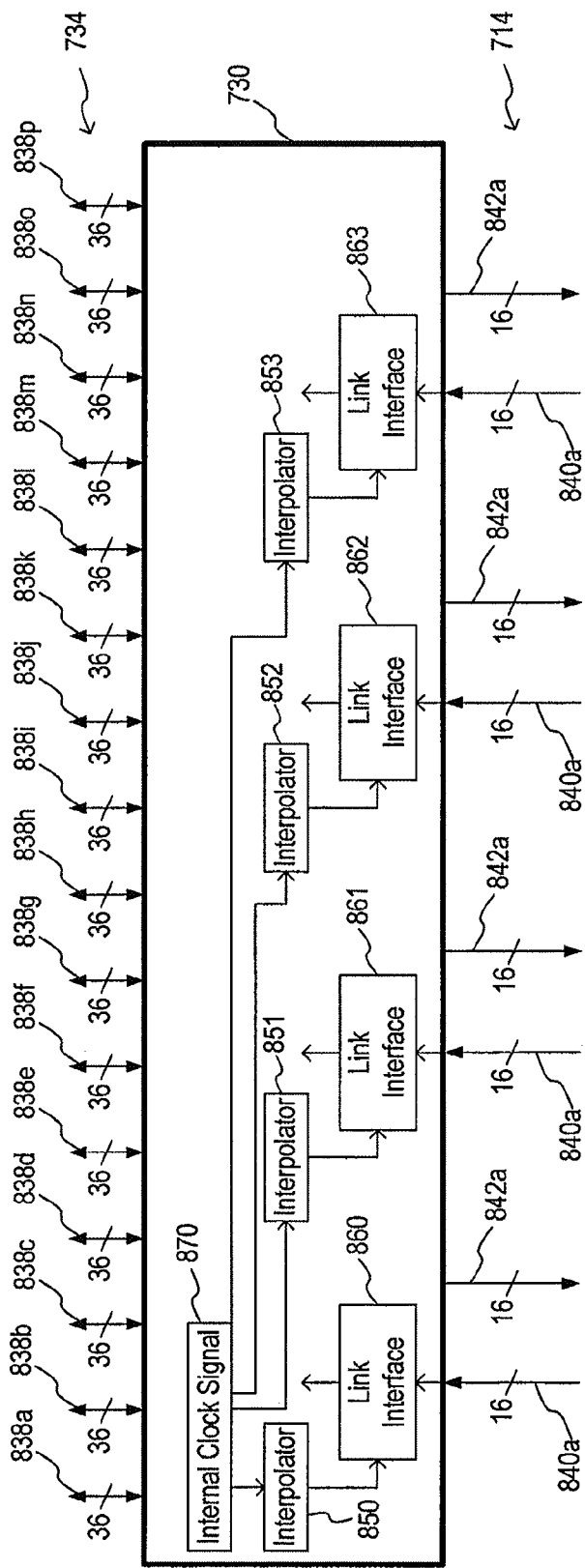
FIG. 8 is a schematic illustration of the logic die 730 of FIG. 7.

FIG. 8 is a schematic illustration of the logic die 730 of FIG. 7. The bus 734 may be divided into 16 36 bit bi directional sub buses 838*a-p*, with each of the 16 36 bit sub buses coupled to the 4 partitions in a respective vault. Each of these sub buses may communicate data between the logic die 730 and the memory die. The bus 714 connecting the processor 712 to the logic die 730 may be divided into 4 16 bit downstream lanes 840*a-d* and 4 separate 16 bit upstream lanes 842*a-d*. Link interfaces 860-863 may be provided, coupled to each of the 16-bit lanes of the bus 714. Link interfaces for the downstream lanes are shown. The link interfaces 860-863 may be configured to capture data from the downstream lanes. Interpolators 850-853 are coupled to the respective link interfaces 860-863 and may receive an internal clock signal 870 and provide clock signals having a programmable phase to the link interfaces for use in capturing the data signals received at the logic die 730. The data received at the logic die from the processor may have been generated, for example, by a clock signal at the processor, and will be captured using a different clock signal, such as the internal clock signal 870 generated on or received by the logic die 730. The interpolators 850-853 may function to adjust a phase of the clock signal used to capture the data, which may compensate for differences between the clock signals of, for example, the processor and the logic die 730. Each of the link interfaces 860-863 may further include a deserializer configured to deserialize 16 serial bits from one of the downstream lanes 840a-d to obtain 256 parallel data bits, which may be provided to one of the 43-bit sub buses 838a-p in a serial stream of 8 bits. The interpolators 850-853 may facilitate accurate capture of data from the processor and, therefore ultimately, to the memory die.

The computer system shown in FIG. 8 may be implemented in any of a variety of products employing processors and memory including for example cameras, phones, wireless devices, displays, chip sets, set top boxes, gaming systems, vehicles, and appliances. Resulting devices employing the memory system may benefit from the embodiments of interpolators described above to perform their ultimate user function.

From the foregoing it will be appreciated that, although specific embodiments of the invention have been described herein for purposes of illustration, various modifications may be made without deviating from the spirit and scope of the invention.

What is claimed is:

1. An apparatus comprising:
a first push-pull buffer configured to receive a first signal and a first current, the first push-pull buffer further configured to provide a first output signal having a first phase based on the first signal and the first current;
a second push-pull buffer configured to receive a second signal and a second current, the second push-pull buffer further configured to provide a second output signal having a second phase based on the second signal and the second current; and
a current source coupled to the first and second push-pull buffers, wherein the current source is configured to be selectively enabled to at least provide the first current.

2. The apparatus of claim 1, wherein the first phase and the second phase have a phase difference of 180-degrees.

3. An apparatus comprising:
a first push-pull buffer configured to receive a first signal and a first current, the first push-pull buffer further configured to provide a first output signal having a first phase based on the first signal and the first current, wherein the first push-pull buffer comprises a first transistor and a second transistor, wherein a gate of the first transistor and a gate of the second transistor are each configured to receive the first signal, and wherein the second push-pull buffer comprises a third transistor and a fourth transistor, wherein a gate of the third transistor and a gate of the fourth transistor are each configured to receive the second signal; and
a second push-pull buffer configured to receive a second signal and a second current, the second push-pull buffer further configured to provide a second output signal having a second phase based on the second signal and the second current.

4. The apparatus of claim 3, wherein the first transistor and the second transistor are coupled at a first node, wherein the first node is configured to provide the first output signal, and wherein the third transistor and the fourth transistor are coupled at a second node, wherein the second node is configured to provide the second output signal.

5. The apparatus of claim 4, wherein the first transistor and the third transistor p-type field-effect transistors (FET), and wherein the second transistor and the fourth transistor n-type field-effect transistors (FET).

6. An apparatus comprising:
a first push-pull buffer configured to receive a first signal and a first current, the first push-pull buffer further configured to provide a first output signal having a first phase based on the first signal and the first current;
a second push-pull buffer configured to receive a second signal and a second current, the second push-pull buffer further configured to provide a second output signal having a second phase based on the second signal and the second current; and
a first bias transistor configured to provide the first current to the first push-pull buffer and to provide the second current to the second push-pull buffer.

7. The apparatus of claim 6, wherein the bias transistor is coupled to a positive voltage source.

8. An apparatus comprising:
a first push-pull buffer configured to receive a first signal and a first current, the first push-pull buffer further configured to provide a first output signal having a first phase based on the first signal and the first current;
a second push-pull buffer configured to receive a second signal and a second current, the second push-pull buffer further configured to provide a second output signal having a second phase based on the second signal and the second current;
a third push-pull buffer configured to receive a third signal and a third current, the third push-pull buffer further configured to provide a third output signal having a third phase based on the third signal and the third current; and
a phase interpolator circuit coupled to the first push-pull buffer, the second push-pull buffer, and the third push-pull buffer, the phase interpolator circuit configured provide a third output signal having a third phase based on a combination of the first signal and the third signal or a combination of the third signal and the second signal.

9. A memory system comprising:
a plurality of memory; and
a logic coupled to the plurality of memory, the logic configured to capture data from the plurality of memory responsive to an output clock signal, wherein the output clock signal is based on a first output signal or a second output signal, the logic comprising:
an interpolator comprising:
a first push-pull buffer configured to provide the first output signal having a first phase based on a first input signal and a first current; and
a second push-pull buffer configured to provide the second output signal having a second phase based on a second input signal and a second current.

10. The memory system of claim 9, wherein the first push-pull buffer comprises a first pair of transistors coupled together at a first output node, wherein a gate of each of the first pair of transistors is configured to receive the first input signal, wherein the first output node is configured to provide the first output signal, and wherein the second push-pull buffer comprises a second pair of transistors coupled together at a second output node, wherein a gate of each of the second pair of transistors is configured to receive the second input signal, wherein the second output node is configured to provide the second output signal.

11. The memory system of claim 9, wherein the output clock signal is further based on a third output signal or a fourth output signal, wherein the interpolator further comprises:
a third push-pull buffer configured to provide a third output signal having a third phase based on a third input signal and a third current; and
a fourth push-pull buffer configured to provide the fourth output signal having a fourth phase based on a fourth input signal and a fourth current.

12. The memory system of claim 11, wherein the first phase and the second phase have a difference of 180 degrees, and wherein the third phase and the fourth phase have a difference of the 180 degrees.

13. The memory system of claim 11, wherein the interpolator further comprises a phase interpolator circuit configured to receive the first output signal, the second output signal, the third output signal, and the fourth output signal, the phase interpolator circuit configured to provide the output clock signal having a fifth phase responsive to a value of a control signal.

14. The memory system of claim 9, further comprising a link interface configured to capture the data from the plurality of memory.

15. The memory system of claim 9, wherein the plurality of memory comprise a memory stack.

16. The memory system of claim 15, wherein memory stack is stacked on the logic.

17. A method comprising:
providing, from a first push-pull buffer, a first output clock signal having a first phase based on a first input signal and a first current;
providing, from a second push-pull buffer, a second output clock signal having a second phase based on a second input signal and a second current; and
providing a mixed output clock signal having a mixed phase based on the first output signal and the second output signal.

18. The method of claim 17, further comprising receiving a control signal, wherein the control signal adjusts the mixed phase of the output clock signal.

19. The method of claim 17, further comprising:
providing, from a third push-pull buffer, a third output clock signal having a third phase based on a third input signal and a third current;
providing, from a fourth push-pull buffer, a fourth output clock signal having a fourth phase based on a fourth input signal and a fourth current; and
wherein providing the mixed output clock signal having the mixed phase is further based on the third output signal or the fourth output signal.

20. The method of claim 19, wherein the first phase and the second phase have a difference of 180 degrees, wherein the first phase and the third phase have a difference of 90 degrees, and wherein the first phase and the fourth phase have a difference of 90 degrees.

21. The method of claim 17, further comprising providing a source current, wherein the first current and the second current are each based on the source current.

* * * * *

UNITED STATES PATENT AND TRADEMARK OFFICE
CERTIFICATE OF CORRECTION

| | | |
|---|---|---|
| PATENT NO. | : 8,861,246 B2 | Page 1 of 1 |
| APPLICATION NO. | : 13/847176 | |
| DATED | : October 14, 2014 | |
| INVENTOR(S) | : Gregory A. King | |

It is certified that error appears in the above-identified patent and that said Letters Patent is hereby corrected as shown below:

In the Claims

In column 8, line 29, in Claim 8, after "configured" insert -- to --.

Signed and Sealed this
Thirtieth Day of December, 2014

Michelle K. Lee
*Deputy Director of the United States Patent and Trademark Office*